United States Patent [19]

Sandhu et al.

[11] Patent Number: 5,139,967

[45] Date of Patent: Aug. 18, 1992

[54] PROCESS FOR PLANARIZING INSULATING DIELECTRIC MATERIAL

[75] Inventors: Gurtej S. Sandhu; Trung T. Doan; Chang Yu, all of Boise, Id.

[73] Assignee: Micron Technology, Inc., Boise, Id.

[21] Appl. No.: 658,987

[22] Filed: Feb. 20, 1991

[51] Int. Cl.$^5$ .................... H01L 21/316; H01L 21/31
[52] U.S. Cl. .................... 437/173; 437/240; 427/53.1
[58] Field of Search .................... 523/201; 427/53.1; 437/173, 240

[56] References Cited

U.S. PATENT DOCUMENTS 4,554,572  11/1985  Chatterjee .................... 357/71
4,609,407  9/1986  Masao et al. .................... 357/91

FOREIGN PATENT DOCUMENTS 0026619  2/1980  Japan .................... 437/173
0215054  12/1983  Japan .................... 437/173

Primary Examiner—Paul R. Michl
Assistant Examiner—Andrew E. C. Merriam
Attorney, Agent, or Firm—Wells, St. John & Roberts

[57] ABSTRACT

A method of processing a semiconductor wafer comprises the following sequential steps:

selectively fabricating a semiconductor wafer in multi-levels to produce desired electronic devices and integrated circuits on the wafer, the selective fabrication resulting in an irregular upper surface topography;

applying a coating of insulating dielectric material having a melting point of less than or equal to about 850° C. atop the fabricated wafer; and selectively impinging laser energy upon the dielectric coating for a selected period of time to at least partially melt the dielectric coating and cause its upper surface to become planarized.

1 Claim, No Drawings

PROCESS FOR PLANARIZING INSULATING DIELECTRIC MATERIAL

TECHNICAL FIELD

This invention relates to planarization of dielectric films on semiconductor wafers.

BACKGROUND OF THE INVENTION

Semiconductor wafers are fabricated by selective layering, patterning and doping steps to form desired electronic devices and interconnecting circuitry. As semiconductor processing technology has advanced to compress more and more electronic devices into a smaller space, the topography of the wafer surface has become more irregular. This has lead to increasing difficulty in wafer processing. Generally, the higher the degree of planarity of the upper wafer surface, the less problems are encountered in processing. This invention specifically concerns techniques for increasing the degree of planarity of dielectric or insulating layers on semiconductor wafers.

In order to build an integrated circuit on a wafer, it is necessary to fabricate many active devices on a single substrate. Initially, each of the devices must be electrically isolated from others. But later in the fabrication sequence, specific devices must be electrically interconnected so as to implement the desired circuit functions. The electrical interconnects in early generations of bipolar integrated circuits typically consisted of a single level of metal and heavily doped diffused regions in the silicon substrate. As the technology progressed however, interconnects with multiple levels of metal became needed, resulting in more processing steps having more layers and a resulting highly irregular wafer surface topography.

Differences in elevation within a given layer, commonly referred to as "steps", can exceed two microns with current ULSI (ultra large scale integration) technology. At some point, such surfaces must be planarized to some degree to prevent the topography roughness from growing with each level. Without planarization, the microscopic canyons that result on the wafer surface from stacking of device features can lead to topography conditions that would reduce the yield of circuits to unacceptably small values.

Planarization of the intermetal dielectric layers is one of the approaches that has been taken to alleviate the problem of rough surface topography. Planarizing of dielectric materials varies in degree from no planarization to smoothing, partial or semi-planarization, complete local planarization, or complete global planarization of the wafer surface. To achieve a degree of planarizing, it is necessary that the dielectric layer being planarized be brought to a temperature sufficient to at least partially melt the material to cause flow and a resulting planarizing effect to the upper surface.

One common dielectric material is $SiO_2$. Pure $SiO_2$ has a very high melting point (approximately 1,200° C.) such that it is not typically used in its pure form as a dielectric material for a layer which will be planarized. At a temperature of 1,200° C., the substrate would potentially be damaged by adverse high temperature effects. Accordingly, materials such as $SiO_2$ are commonly doped with other materials, such as boron and phosphorous which is such case would produce borophosilicate glass (BPSG). Such compositions have melting temperatures between about 800° C. and 850° C., depending upon boron and phosphorus concentration, which is a processing temperature which will typically not damage the wafer circuitry. BPSG is a common material for the last protective coating applied atop the wafer at the conclusion of circuit fabrication.

The typical way of planarizing a BPSG, or other dielectric layer having a melting point of 850° C. or less, is to heat the wafer in an inert atmosphere at 900° C. for a predetermined period of time, such as 30 minutes, to cause melting and flow. An alternate prior art process is to use rapid thermal processing (RTP) or rapid thermal annealing (RTA). Yet another alternate method includes applying a thick layer of BPSG or other dielectric and etching the layer back to produce a planarized upper surface.

This invention provides an alternate method of planarizing dielectric films having melting temperatures which are below approximately 850° C.

DETAILED DESCRIPTION OF THE PREFERRED EMBODIMENTS

The following disclosure of the invention is submitted in furtherance with the constitutional purpose of the U.S. Patent Laws "to promote the progress of science and useful arts" (Article 1, Section 8).

In accordance with the invention, a semiconductor water is selectively fabricated with multilevels to produce desired electronic devices and integrated circuits on the wafer which results in an irregular upper surface topography. Such fabrication may produce an upper surface topography having high and low points which are separated from one another by one or more microns.

A coating of insulating dielectric material having a melting point of less than or equal to about 850° C., such as BPSG, is applied atop the fabricated wafer to a desired thickness. Then, laser energy is selectively impinged upon the insulating coating at a desired laser intensity (termed "fluence"), expected to be from 0.5 Joules/cm$^2$ to 10.0 Joules/cm$^2$, for a selected period of time to at least partially melt the insulating coating and cause its upper surface to be planarized to a degree greater than it was before laser application. The laser fluence and exposure time will depend in part upon the thickness of the layer being planarized. The thicker the layer, the higher will be the required fluence and/or time period of exposure to produce a planarizing effect. It is expected that laser energies of from 1.0 to 10.0 Joules/cm$^2$ will be the preferred fluence range in accordance with the invention, with dielectric layers of one micron or more requiring laser fluence towards the high end of this range. An example of such a thick layer would be the last layer of protective insulating material that is applied atop the completed wafer. The invention has not been reduced to practice at this writing.

Laser energy would be applied most preferably with an intermittent pulsed laser, or alternately with a continuous scanning laser. An example laser would be a XeCl excimer laser. Exposure time with an intermittent laser would provide pulses most preferably of approximately 25 nanoseconds for a given area of wafer.

Laser planarization has been used in the prior art for planarizing metal films, such as aluminum and its alloys, but has heretofore not been discovered as a viable alternative to planarization of dielectric materials having melting points below 850° C. Metal films have a very high reflectivity of impinging laser energy and a very low absorption of such energy. Accordingly, planarizing of metal films in accordance with the prior art transmits significant laser energy into the underlying wafer, which can lead to thermal degradation effects. However dielectric materials such as BPSG are largely transparent materials which do not reflect much of the impinged laser energy, and as well absorb essentially all of the laser energy impinged upon them. Accordingly, planarizing dielectric films in accordance this invention results in substantial absorption of the laser energy by the dielectric layer, resulting in enhanced thermal efficiency and negligible problems associated with potential damage of the underlying substrate.

For example, the Table below compares reflectivity and flow temperatures for aluminum and two BPSG materials. As indicated, reflectivity of BPSG is 3.4 times smaller than that for aluminum. BPSG will therefore absorb much more incident energy compared to aluminum. Since the temperature required to flow BPSG is less than twice that for aluminum, laser planarization of BPSG is a viable planarizing process.

| Material | Temperature required for flowing (°C.) | Reflectivity (%) (relative to Si) |
| --- | --- | --- |
| Aluminum | 550 | 220 |
| BPSG (4% B, 4% P) | 800 | 65 |
| BPSG (3% B, 6% P) | 850 | 65 |

Another advantage associated with the invention is increased wafer throughput as compared to furnace annealing methods, and obviating furnace contamination associated therewith.

In compliance with the statute, the invention has been described in language more or less specific as to methodical features. It is to be understood, however, that the invention is not limited to the specific features described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method of processing a semiconductor wafer comprising the following sequential steps:

selectively fabricating a semiconductor wafer in multilevels to produce desired completed electronic devices and integrated circuits on the wafer, the selective fabrication resulting in an irregular upper surface topography having high and low points separated from one another by at least one micron;

applying a protective coating of borophosphosilicate glass insulating dielectric material having a melting point of less than or equal to about 850° C. atop the fabricated wafer; and selectively impinging excimer laser energy directly upon the protective insulating coating at a fluence of from 0.5 Joules/cm$^2$ to 10.0 Joules/cm$^2$ with intermittent pulses having a pulse on period of approximately 25 nanoseconds for a selected period of time to melt the protective insulating coating and cause its upper surface to become planarized.

* * * * *